United States Patent
Chaudhry et al.

(10) Patent No.: US 9,997,509 B2
(45) Date of Patent: Jun. 12, 2018

(54) ELECTROSTATIC DISCHARGE (ESD) PROTECTION CIRCUIT

(71) Applicant: RF Micro Devices, Inc., Greensboro, NC (US)

(72) Inventors: Muhammad Iqbal Chaudhry, Greensboro, NC (US); Nathaniel Peachey, Oak Ridge, NC (US)

(73) Assignee: Qorvo US, Inc., Greensboro, NC (US)

( * ) Notice: Subject to any disclaimer, the term of this patent is extended or adjusted under 35 U.S.C. 154(b) by 478 days.

(21) Appl. No.: 14/687,310

(22) Filed: Apr. 15, 2015

(65) Prior Publication Data

US 2015/0325568 A1    Nov. 12, 2015

Related U.S. Application Data

(60) Provisional application No. 61/991,128, filed on May 9, 2014.

(51) Int. Cl.
*H02H 9/00* (2006.01)
*H01L 27/02* (2006.01)

(52) U.S. Cl.
CPC ...... *H01L 27/0251* (2013.01); *H01L 27/0259* (2013.01)

(58) Field of Classification Search
CPC .................................................. H01L 27/0251
USPC .......................................................... 361/56
See application file for complete search history.

(56) References Cited

U.S. PATENT DOCUMENTS

| | | | |
|---|---|---|---|
| 6,917,207 B1 * | 7/2005 | Blumenthal | H02H 9/046 324/677 |
| 7,453,676 B2 * | 11/2008 | Huh | H02H 9/046 361/56 |
| 7,929,263 B1 | 4/2011 | Peachey et al. | |
| 7,969,699 B2 | 6/2011 | Fan et al. | |

(Continued)

OTHER PUBLICATIONS

Mergens, M.P.J. et al., "Diode-Triggered SCR (DTSCR) for RF-ESD Protection of BiCMOS SiGe HBTs and CMOS Ultra-Thin Gate Oxides," IEEE International Electron Devices Meeting, 2003, IEDM '03 Technical Digest, Dec. 8-10, 2003, pp. 21.3.1-21.3.4.

(Continued)

*Primary Examiner* — Stephen W Jackson
(74) *Attorney, Agent, or Firm* — Withrow & Terranova, P.L.L.C.

(57) ABSTRACT

Aspects disclosed in the detailed description include an electrostatic discharge (ESD) protection circuit. In this regard, in one aspect, an ESD protection circuit is provided to protect an integrated circuit (IC) during fabrication and production. An ESD detection circuitry detects an ESD event by detecting a voltage spike between a supply rail and a ground rail exceeding an ESD threshold voltage. In response to detecting the ESD event, an ESD clamping circuitry is activated to discharge the ESD event, thus protecting the IC from being damaged by the ESD event. By detecting the ESD event based on the ESD threshold voltage, as opposed to detecting the ESD event based on rise time of the voltage spike, it is possible to prevent the ESD clamping circuitry from missing voltage spikes associated with a slow rise time or being falsely activated by a normal power-on voltage associated with a fast rise time.

18 Claims, 8 Drawing Sheets

(56) References Cited

U.S. PATENT DOCUMENTS 8,278,684 B1 * 10/2012 Walker ............... H01L 27/0262
257/173

OTHER PUBLICATIONS

Voldman, S.H. et al., "Silicon Germanium Heterojunction Bipolar Transistor ESD Power Clamps and the Johnson Limit," Electrical Overstress/Electrostatic Discharge Symposium, 2001, EOS/ESD '01, pp. 324-334.

* cited by examiner

US 9,997,509 B2

ELECTROSTATIC DISCHARGE (ESD) PROTECTION CIRCUIT

RELATED APPLICATIONS

This application claims the benefit of U.S. provisional patent application No. 61/991,128, filed May 9, 2014, the disclosure of which is incorporated herein by reference in its entirety.

FIELD OF THE DISCLOSURE

The technology of the disclosure relates generally to protecting integrated circuits (ICs) during fabrication and production.

BACKGROUND

Mobile communication devices have become increasingly common in current society. The prevalence of these mobile communication devices is driven in part by the many functions that are now enabled on such devices. Demand for such functions increases the processing capability requirements for the mobile communication devices. As a result, increasingly complex integrated circuits (ICs) have been designed and manufactured to provide increasingly greater functionality in the mobile communication devices. Concurrent with the increases in complexity of the ICs, there has been pressure to decrease the footprint of the ICs as well.

It has become more challenging to increase yields and improve quality of the ICs during fabrication and production processes. As such, there is a growing interest in the effect of electrostatic discharge (ESD) during fabrication of the ICs, assembly of devices that use the ICs, and the operation of the ICs. ESD can be seen as a miniature lightning bolt of static charge between two surfaces that have different electrical potentials. Without proper protection, static charge movement associated with ESD may generate an electrical current high enough to damage or even destroy the passive and active devices, such as diodes and transistors, thus, rendering the ICs dysfunctional.

SUMMARY

Aspects disclosed in the detailed description include an electrostatic discharge (ESD) protection circuit. In this regard, in one aspect, an ESD protection circuit is provided to protect an integrated circuit (IC) from an ESD event. ESD detection circuitry detects an ESD event in the IC when the ESD detection circuitry detects a voltage spike between a supply rail and a ground rail exceeding an ESD threshold voltage. In response to detecting the ESD event, an ESD clamping circuitry is activated to discharge the ESD event, thus protecting the IC from being damaged by the ESD event. By detecting the ESD event based on the ESD threshold voltage, as opposed to detecting the ESD event based on the rise time of the voltage spike associated with the ESD event, it is possible to prevent the ESD clamping circuitry from missing voltage spikes associated with a slow rise time or being falsely activated by a normal power-on voltage associated with a fast rise time.

In another aspect, an ESD protection circuit in an IC is provided. The ESD protection circuit comprises ESD clamping circuitry coupled between a supply rail and a ground rail and configured to discharge an ESD event in an IC in response to an activation signal. The ESD protection circuit also comprises latch circuitry coupled to the ESD clamping circuitry and configured to provide the activation signal in response to receiving an indication signal. The ESD protection circuit also comprises ESD detection circuitry. The ESD detection circuitry is configured to detect when a voltage between the supply rail and the ground rail exceeds an ESD threshold voltage. The ESD detection circuitry is also configured to provide the indication signal in response to detecting the voltage between the supply rail and the ground rail exceeding the ESD threshold voltage.

In another aspect, an electronic system is provided. The electronic system comprises at least one functional circuit. The electronic system also comprises an ESD protection circuit coupled to the at least one functional circuit. The ESD protection circuit comprises ESD clamping circuitry coupled between a supply rail and a ground rail and configured to discharge an ESD event in the at least one functional circuit in response to an activation signal. The ESD protection circuit also comprises latch circuitry coupled to the ESD clamping circuitry and configured to provide the activation signal in response to receiving an indication signal. The ESD protection circuit also comprises ESD detection circuitry. The ESD detection circuitry is configured to detect when a voltage between the supply rail and the ground rail exceeds an ESD threshold voltage. The ESD detection circuitry is also configured to provide the indication signal in response to detecting the voltage between the supply rail and the ground rail exceeding the ESD threshold voltage.

Those skilled in the art will appreciate the scope of the disclosure and realize additional aspects thereof after reading the following detailed description in association with the accompanying drawings.

BRIEF DESCRIPTION OF THE DRAWINGS

The accompanying drawings incorporated in and forming a part of this specification illustrate several aspects of the disclosure, and together with the description serve to explain the principles of the disclosure.

DETAILED DESCRIPTION

The embodiments set forth below represent the necessary information to enable those skilled in the art to practice the disclosure and illustrate the best mode of practicing the disclosure. Upon reading the following description in light of the accompanying drawings, those skilled in the art will understand the concepts of the disclosure and will recognize applications of these concepts not particularly addressed herein. It should be understood that these concepts and applications fall within the scope of the disclosure and the accompanying claims.

Aspects disclosed in the detailed description include an electrostatic discharge (ESD) protection circuit. In this regard, in one aspect, an ESD protection circuit is provided to protect an integrated circuit (IC) from an ESD event. ESD detection circuitry detects an ESD event in the IC when the ESD detection circuitry detects a voltage spike between a supply rail and a ground rail exceeding an ESD threshold voltage. In response to detecting the ESD event, an ESD clamping circuitry is activated to discharge the ESD event, thus protecting the IC from being damaged by the ESD event. By detecting the ESD event based on the ESD threshold voltage, as opposed to detecting the ESD event based on the rise time of the voltage spike associated with the ESD event, it is possible to prevent the ESD clamping circuitry from missing voltage spikes associated with a slow rise time or being falsely activated by a normal power-on voltage associated with a fast rise time.

Figure 1:
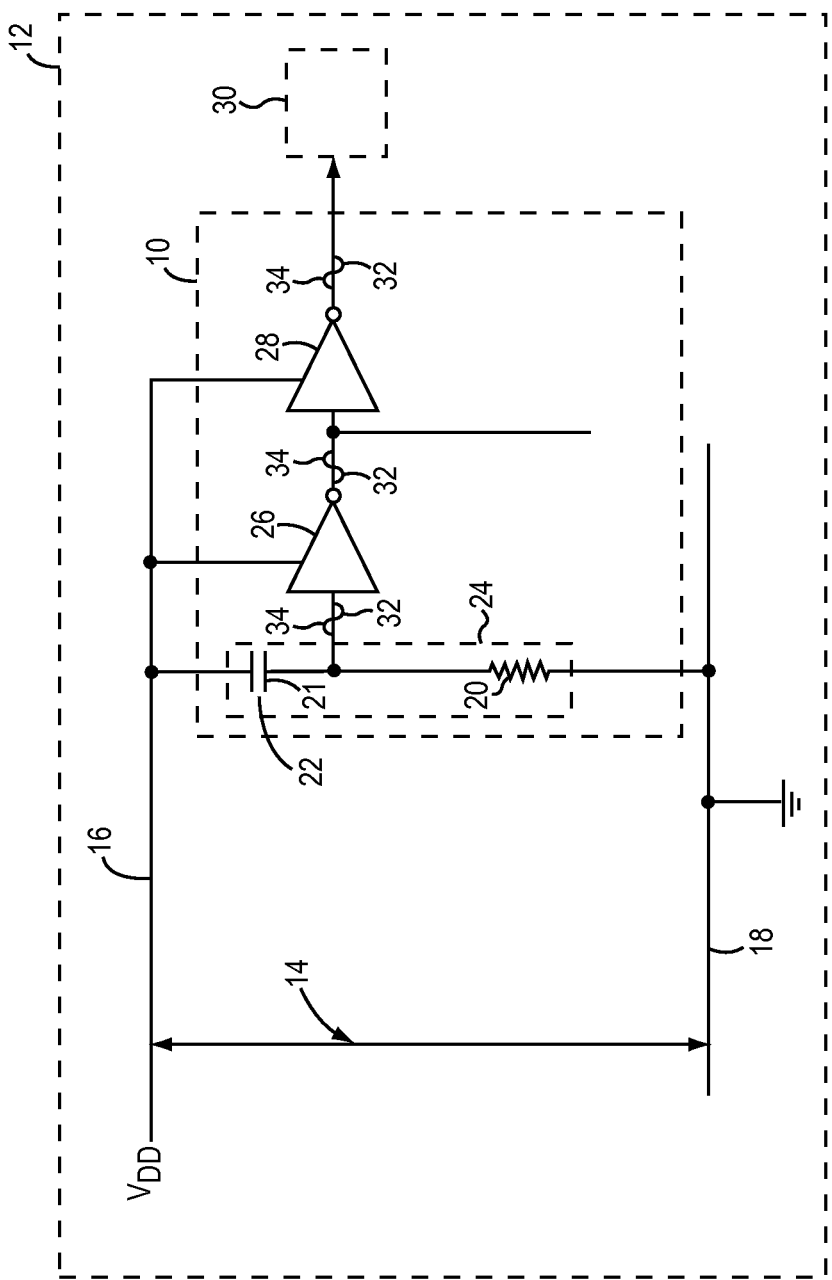
FIG. 1 is a schematic diagram of an exemplary conventional electrostatic discharge (ESD) detection circuit configured to detect an ESD event in an integrated circuit (IC) based on rising times of a voltage spike between a supply rail and a ground rail in the IC.

Before discussing the ESD protection concepts of the present disclosure, a brief overview of a conventional approach for detecting an ESD event in an electronic circuit that may benefit from exemplary aspects of the present disclosure is provided with reference to FIG. 1. The discussion of specific exemplary aspects of ESD protection circuit starts below with reference to FIG. 2.

In this regard, FIG. 1 is a schematic diagram of an exemplary conventional ESD detection circuit 10 configured to detect an ESD event in an IC 12 based on the rise time of a voltage spike 14 between a supply rail 16 and a ground rail 18.

With reference to FIG. 1, insulator surfaces (not shown) may be rubbing together or pulling apart during fabrication and production of the IC 12. As a result, one surface may be gaining electrons, while another surface loses the electrons, thus creating an unbalanced electrical condition known as static charge. An ESD event occurs when the voltage spike 14 breaks down dielectric strength of the medium between the two surfaces. As a result, the static charge moves from one surface to another due to sufficiently high voltage differential between the two surfaces. When the static charge moves, it becomes an electrical current (not shown) that can damage or even destroy the IC 12. In this regard, the IC 12 must be protected from the voltage spike 14 during fabrication and production.

With continuing reference to FIG. 1, the conventional ESD detection circuit 10 comprises a resistor 20 and a capacitor 22 disposed in a serial arrangement. The resistor 20 and the capacitor 22 form a resistor-capacitor (RC) charging circuit 24. The RC charging circuit 24 is configured to feed a first inverter 26, which in turn feeds a second inverter 28 to activate an ESD clamping circuitry 30 to when the voltage spike 14 occurs.

The conventional ESD detection circuit 10 is designed to activate or not activate the ESD clamping circuitry 30 based on rise time of the voltage spike 14. When the voltage spike 14 does not occur in the IC 12 (e.g., a steady state), a bottom plate 21 of the capacitor 22 is at ground and feeds a logical LOW 32 to the first inverter 26. The first inverter 26 inverts the logical LOW 32 into a logical HIGH 34. The second inverter 28 receives and inverts the logical HIGH 34 back to the logical LOW 32, which keeps the ESD clamping circuitry 30 deactivated. When the voltage spike 14 occurs, the supply voltage of the first inverter 26 and the second inverter 28 follow the voltage spike 14. As a result, input voltage thresholds of the first inverter 26 and the second inverter 28 raise to the level of the voltage spike 14.

Since the capacitor 22 cannot be charged up to the level of the voltage spike 14 instantaneously, the RC charging circuit 24 will momentarily provide the logical HIGH 34 to the first inverter 26. The first inverter 26 inverts the logical HIGH 34 to the logical LOW 32. The second inverter 28 then inverts the logical LOW 32 to the logical HIGH 34 to activate the ESD clamping circuitry 30 to discharge the voltage spike 14. Gradually, the capacitor 22 will once again charge up to the voltage spike 14, thus causing the RC charging circuit 24 to output the logical LOW 32 again. As discussed above, the logical LOW 32 will eventually deactivate the ESD clamping circuitry 30. In this regard, the conventional ESD detection circuit 10 is able to protect the IC 12 from the voltage spike 14 only if the rise time of the voltage spike 14 is faster than a duration needed by the capacitor 22 to charge up to the voltage spike 14.

The conventional ESD detection circuit 10 has two obvious drawbacks. First, if the rise time of the voltage spike 14 is slower than the duration needed by the capacitor 22 to charge up to the voltage spike 14, the ESD clamping circuitry 30 will not be activated in time to protect the IC 12. Second, if the rise time of a normal operation voltage (e.g., $V_{DD}$) for the IC 12 happens to be faster than the duration needed by the capacitor 22 to charge up to the voltage spike 14, the ESD clamping circuitry 30 can be falsely activated. Therefore, it is unreliable to activate the ESD clamping circuitry 30 based on the rise time of the voltage spike 14.

Figure 2:
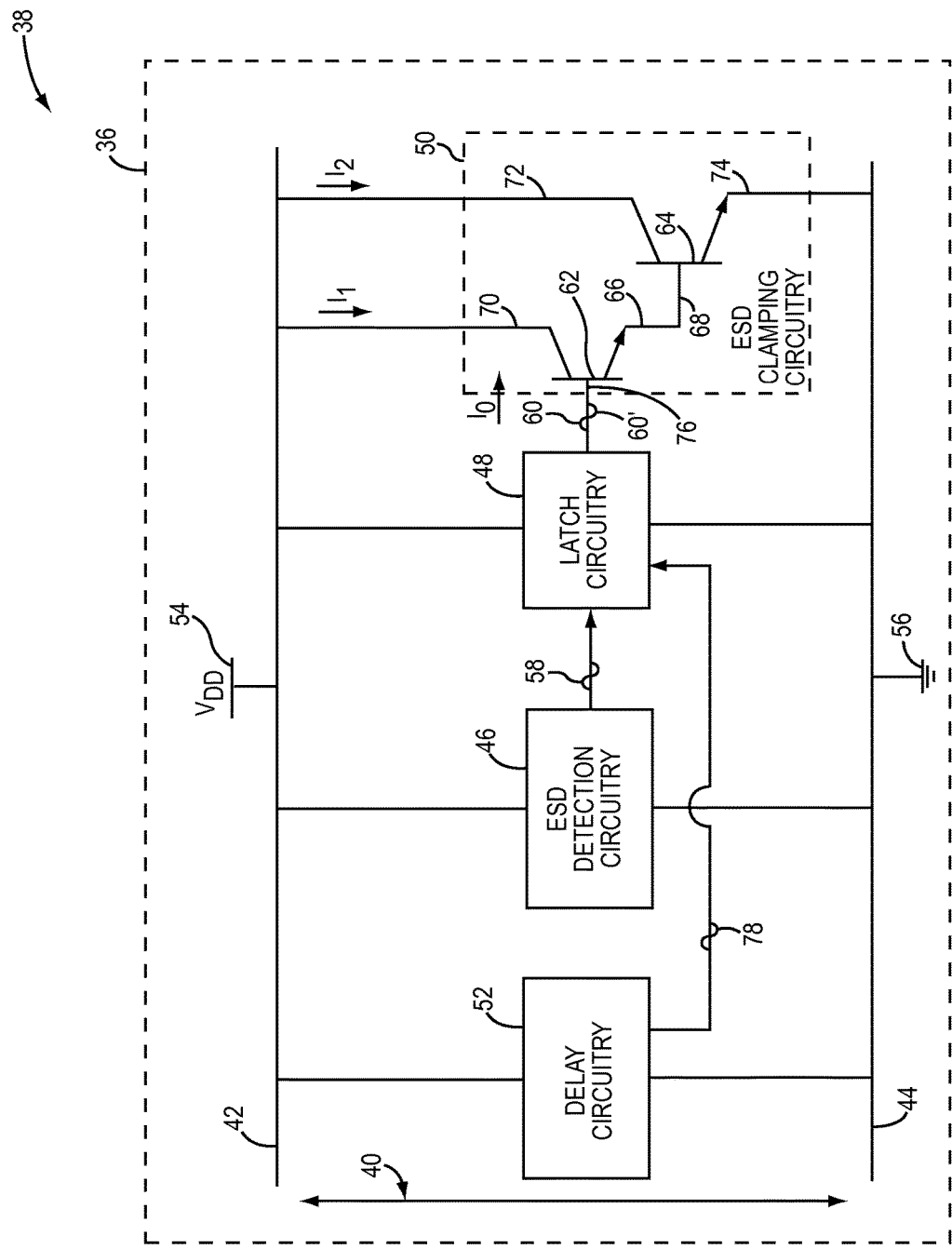
FIG. 2 is a schematic diagram of an exemplary ESD protection circuit configured to discharge an ESD event in an IC when a voltage spike between a supply rail and a ground rail exceeds an ESD threshold voltage.

In this regard, FIG. 2 is a schematic diagram of an exemplary ESD protection circuit 36 configured to discharge an ESD event in an IC 38 when a voltage spike 40 between a supply rail 42 and a ground rail 44 exceeds an ESD threshold voltage (not shown). In a non-limiting example, the ESD protection circuit 36 is configured to provide the IC 38 during fabrication and production. The ESD protection circuit 36 comprises an ESD detection circuitry 46, a latch circuitry 48, an ESD clamping circuitry 50, and a delay circuitry 52. The supply rail 42 and the ground rail 44 are coupled to a voltage source 54 and a ground 56, respectively. In a non-limiting example, the voltage source 54 is coupled to a $V_{DD}$ voltage.

With continuing reference to FIG. 2, in a non-limiting example, the ESD detection circuitry 46 is coupled between the supply rail 42 and ground rail 44 to detect if the voltage spike 40 exceeds the ESD threshold voltage. The ESD event is detected if the voltage spike 40 exceeds the ESD threshold voltage. When the ESD detection circuitry 46 detects the voltage spike 40 exceeding the ESD threshold voltage, the ESD detection circuitry 46 provides an indication signal 58 to the latch circuitry 48. In a non-limiting example, the ESD detection circuitry 46 asserts a logical HIGH as the indication signal 58. In response to receiving the indication signal 58, the latch circuitry 48 provides an activation signal 60, which is logical HIGH, to activate the ESD clamping circuitry 50 to discharge the ESD event in the IC 38. In a non-limiting example, the activation signal 60 may be an electrical current signal. In a non-limiting example, the ESD threshold voltage is configured to be higher than the $V_{DD}$ voltage to prevent the ESD clamping circuitry 50 from being activated when the IC 38 is powered up for operation by the $V_{DD}$ voltage. By detecting the voltage spike 40 based on the ESD threshold voltage, it is possible to prevent the ESD clamping circuitry 50 from missing the voltage spike 40 when the voltage spike 40 is associated with a slow rise time or being falsely activated by the $V_{DD}$ voltage associated with a fast rise time.

With continuing reference to FIG. 2, the ESD clamping circuitry 50 comprises a first bipolar transistor 62 and a second bipolar transistor 64 disposed according to a Darlington pair arrangement. In a non-limiting example, the first bipolar transistor 62 and the second bipolar transistor 64 are N-type-P-type-N-type (NPN) bipolar transistors. In another non-limiting example, the ESD clamping circuitry 50 may comprise a metal-oxide semiconductor (MOS) device. In another non-limiting example, the ESD clamping circuitry 50 may also comprise MOS field-effect transistors (MOSFETs). According to the Darlington pair arrangement, a first bipolar transistor emitter electrode 66 is coupled to a second bipolar transistor base electrode 68. A first bipolar transistor collector electrode 70 and a second bipolar transistor collector electrode 72 are both coupled to the supply rail 42. A second bipolar transistor emitter electrode 74 is coupled to the ground rail 44. A first bipolar transistor base electrode 76 is coupled to the latch circuitry 48 to receive the activation signal 60. The first bipolar transistor 62 and the second bipolar transistor 64 are both current-operated devices.

When the activation signal 60 (logical HIGH) is applied between the first bipolar transistor base electrode 76 and the ground rail 44, a small current ($I_0$) through the first bipolar transistor base electrode 76 will cause a first bipolar transistor current ($I_1$), which is larger than the small current ($I_0$), between the first bipolar transistor collector electrode 70 and the first bipolar transistor emitter electrode 66. The first bipolar transistor current ($I_1$) applied to the second bipolar transistor base electrode 68 will trigger a second bipolar transistor current ($I_2$), which is larger than the first bipolar transistor current ($I_1$), between the second bipolar transistor collector electrode 72 and the second bipolar transistor emitter electrode 74. The first bipolar transistor 62 and the second bipolar transistor 64 are current-amplifying devices because $I_2 > I_1 > I_0$. As a result, when activated by the activation signal 60, the ESD clamping circuitry 50 can instantaneously discharge a large ESD current ($I_0 + I_1 + I_2$) associated with the voltage spike 40.

With continuing reference to FIG. 2, the ESD clamping circuitry 50 needs to be deactivated after the ESD event is discharged. If the ESD clamping circuitry 50 remains activated when the IC 38 is powered up for normal operation, the IC 38 may not be sufficiently powered to perform as designed. The delay circuitry 52 is configured to deactivate the ESD clamping circuitry 50 after the ESD clamping circuitry 50 is activated for a predetermined protection period. As is discussed next in FIG. 3, the predetermined protection period corresponds to an RC time constant ($\tau$) of the delay circuitry 52. To deactivate the ESD clamping circuitry 50, the delay circuitry 52 provides a cancellation signal 78, which is logical HIGH, to the latch circuitry 48. In response to receiving the cancellation signal 78, the latch circuitry 48 provides a deactivation signal 60', which is logical LOW, to deactivate the ESD clamping circuitry 50.

Figure 3:
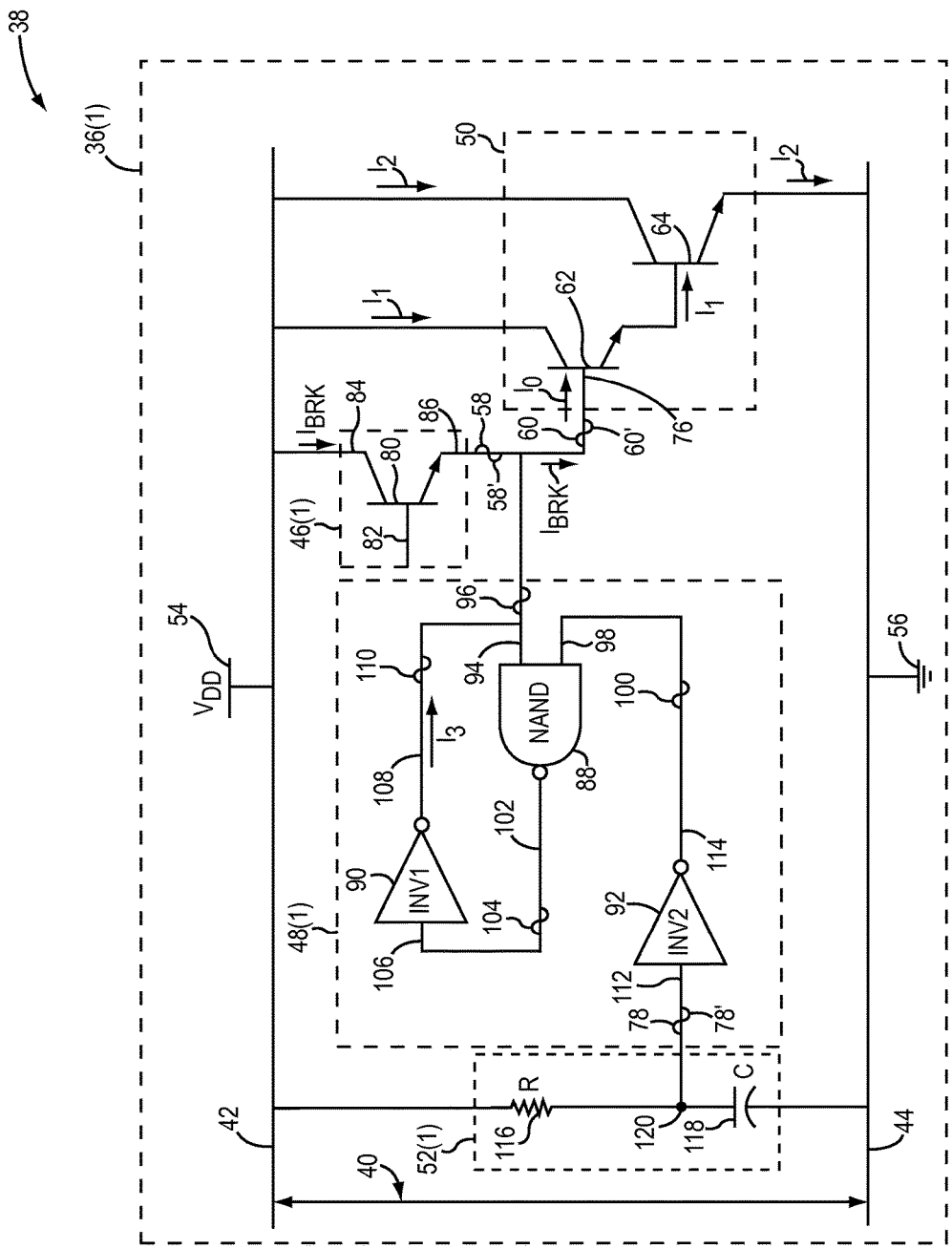
FIG. 3 is a schematic diagram of an exemplary ESD protection circuit in the IC of FIG. 2 with further illustrations of an ESD detection circuitry, a latch circuitry, and a delay circuitry in the ESD protection circuit.

To further illustrate functions and interrelations of the ESD detection circuitry 46, the latch circuitry 48, the ESD clamping circuitry 50, and the delay circuitry 52, FIG. 3 is provided. In this regard, FIG. 3 is a schematic diagram of an exemplary ESD protection circuit 36(1) with further illustrations of an ESD detection circuitry 46(1), a latch circuitry 48(1), and a delay circuitry 52(1) in the ESD protection circuit 36(1). Common elements between FIGS. 2 and 3 are shown therein with common element numbers and will not be re-described herein.

With reference to FIG. 3, the ESD detection circuitry 46(1) comprises an open-base bipolar transistor 80. In a non-limiting example, the open-base bipolar transistor 80 is an NPN bipolar transistor. The open-base bipolar transistor 80 comprises a base electrode (open-base bipolar transistor base electrode) 82, a collector electrode (open-base bipolar transistor collector electrode) 84, and an emitter electrode (open-base bipolar transistor emitter electrode) 86. Unlike the first bipolar transistor 62 and the second bipolar transistor 64 in the ESD clamping circuitry 50, the open-base bipolar transistor 80 does not function as a current-amplifying device since the base electrode 82 is kept floating. Instead, the open-base bipolar transistor 80 is configured to allow a current ($I_{BRK}$) from the collector electrode 84 to the emitter electrode 86 when a voltage applied between the collector electrode 84 and the emitter electrode 86 exceeds a breakdown voltage of the open-base bipolar transistor 80. This characteristic of the open-base bipolar transistor 80 is also known as working in a collector-to-emitter breakdown region. As previously discussed in FIG. 2, when activated by the activation signal 60, the ESD clamping circuitry 50 can rapidly discharge a large ESD current associated with the voltage spike 40. Given that the emitter electrode 86 is coupled to the first bipolar transistor base electrode 76 and the latch circuitry 48(1), the current ($I_{BRK}$) triggers the latch circuitry 48(1) into an on-state. The latch circuitry 48(1) generates a latch circuit current ($I_3$). In this regard, the small current ($I_0$) applied to the first bipolar transistor base electrode 76 is a combination of the $I_{BRK}$ and the $I_3$ ($I_0 = I_{BRK} + I_3$). Hence, when activated by the activation signal 60, the ESD clamping circuitry 50 can rapidly discharge the ESD current ($I_0 + I_1 + I_2$) associated with the voltage spike 40.

The ESD threshold voltage is set based on the breakdown voltage of the open-base bipolar transistor 80 to trigger the collector-to-emitter breakdown and provide the current ($I_{BRK}$) to the ESD clamping circuitry 50. In a non-limiting example, the ESD threshold voltage equals the breakdown voltage of the open-base bipolar transistor 80. Thus, for example, if the breakdown voltage (collector-to-emitter breakdown voltage) is five volts (5V), the ESD threshold voltage will be at least 5V and the latch circuitry 48(1) will be triggered into the on-state.

When the voltage spike 40 exceeds the ESD threshold voltage, the collector-to-emitter breakdown occurs in the open-base bipolar transistor 80. As a result, the emitter electrode 86 is pulled up to the voltage level of the supply rail 42 minus the collector-to-emitter breakdown voltage, thus providing the indication signal 58 to the latch circuitry 48(1) as logical HIGH. In contrast, if the voltage spike 40 does not exceed the ESD threshold voltage, there will be no collector-to-emitter breakdown in the open-base bipolar transistor 80, and the emitter electrode 86 is at the same voltage level as the ground rail 44. Therefore, an indication signal 58' will be logical LOW, indicating that the ESD event is not detected in the IC 38. In another non-limiting example, the ESD detection circuitry 46(1) may comprise a metal-oxide semiconductor (MOS) device, a Zener diode, a Schottky diode, or a string of diodes disposed in series.

With continuing reference to FIG. 3, the latch circuitry 48(1) comprises a negative-AND (NAND) gate 88, a first inverter 90, and a second inverter 92. The NAND gate 88 comprises a first input terminal 94 configured to receive a first gate input signal 96. The NAND gate 88 also comprises a second input terminal 98 configured to receive a second gate input signal 100. The NAND gate 88 also comprises an output terminal 102 configured to output a gate output signal 104. The NAND gate 88 may receive the first gate input signal 96 and the second gate input signal 100 as a combination of logical HIGH and logical LOW. The NAND gate 88 outputs the gate output signal 104 as logical LOW when the first gate input signal 96 and the second gate input signal 100 are both logical HIGH. Otherwise, the NAND gate 88 outputs the gate output signal 104 as logical HIGH.

The first input terminal 94 is coupled to the emitter electrode 86 of the open-base bipolar transistor 80 in the ESD detection circuitry 46(1) and the first bipolar transistor base electrode 76 in the ESD clamping circuitry 50. As discussed above, the emitter electrode 86 is pulled up when the voltage spike 40 exceeds the ESD threshold voltage or remains unchanged when the voltage spike 40 does not exceed the ESD threshold voltage. In this regard, the NAND gate 88 receives the indication signal 58 (logical HIGH) as the first gate input signal 96 when the voltage spike 40 exceeds the ESD threshold voltage. The indication signal 58 will begin a regenerative process (positive feedback) in the latch circuitry 48(1) that will switch the latch circuitry 48(1) into the on-state. Accordingly, the NAND gate 88 receives the indication signal 58' (logical LOW) as the first gate input signal 96 when the voltage spike 40 does not exceed the ESD threshold voltage.

With continuing reference to FIG. 3, the first inverter 90 comprises a first inverter input terminal 106 and a first inverter output terminal 108. The first inverter input terminal 106 is coupled to the output terminal 102 to receive the gate output signal 104. The first inverter 90 is configured to invert the received gate output signal 104 to generate a control signal 110. The first inverter output terminal 108 is coupled to the first bipolar transistor base electrode 76 in the ESD clamping circuitry 50. In this regard, the ESD clamping circuitry 50 receives the control signal 110 as the activation signal 60 when the ESD detection circuitry 46(1) detects the voltage spike 40 exceeding the ESD threshold voltage. Similarly, the ESD clamping circuitry 50 receives the control signal 110 as the deactivation signal 60' when the ESD detection circuitry 46(1) does not detect the voltage spike 40 exceeding the ESD threshold voltage. The first inverter output terminal 108 is also coupled to the first input terminal 94 of the NAND gate 88 to provide a positive feedback to the NAND gate 88. Because both the NAND gate 88 and the first inverter 90 operate as amplifiers, the positive feedback from the first inverter 90 can speed up activation of the ESD clamping circuitry 50 when the voltage spike 40 exceeds the ESD threshold voltage.

The second inverter 92 comprises a second inverter input terminal 112 and a second inverter output terminal 114. The second inverter 92 receives the cancellation signal 78 from the delay circuitry 52(1) and inverts the received cancellation signal 78 to provide the second gate input signal 100. The delay circuitry 52(1) comprises a resistor 116 and a capacitor 118 disposed in a serial arrangement. The delay circuitry 52(1) is an RC charging circuit coupled between the supply rail 42 and the ground rail 44. The second inverter input terminal 112 of the second inverter 92 is coupled to a coupling point 120 located between the resistor 116 and the capacitor 118.

When the voltage spike 40 does not occur between the supply rail 42 and the ground rail 44, the capacitor 118 is not charged and the voltage at the coupling point 120 is pulled down to the ground rail 44. Accordingly, the delay circuitry 52(1) generates a cancellation signal 78' as logical LOW, and the second inverter 92 subsequently generates the second gate input signal 100 as logical HIGH. At the same time, the NAND gate 88 also receives the indication signal 58' (logical LOW) as the first gate input signal 96. Therefore, the gate output signal 104 is logical HIGH, and the control signal 110 is logical LOW. The ESD clamping circuitry 50 receives the control signal 110 (logical LOW) as the deactivation signal 60' and remains deactivated.

When the voltage spike 40 between the supply rail 42 and the ground rail 44 exceeds the ESD threshold voltage, the open-base bipolar transistor 80 experiences the collector-to-emitter breakdown and the emitter electrode 86 is pulled up to the voltage level of the voltage spike 40 minus the collector-to-emitter breakdown voltage of the open-base bipolar transistor 80. As a result, the indication signal 58 (logical HIGH) is provided to the NAND gate 88 as the first gate input signal 96. Because the capacitor 118 cannot be charged up to the voltage level of the voltage spike 40 instantaneously, the voltage at the coupling point 120 will not change instantaneously either. As a result, the delay circuitry 52(1) still generates the cancellation signal 78' as logical LOW, and the second inverter 92 still generates the second gate input signal 100 as logical HIGH. The NAND gate 88 now receives the first gate input signal 96 as logical HIGH and the second gate input signal 100 as logical HIGH. As a result, the gate output signal 104 becomes logical LOW and the control signal 110 becomes logical HIGH. The ESD clamping circuitry 50 receives the control signal 110 (logical HIGH) as the activation signal 60 and is activated to discharge the ESD event.

The duration needed by the capacitor 118 to charge up to the voltage spike 40 depends on an RC time constant ($\tau$) of the delay circuitry 52(1), which is configured as an RC charging circuit. The RC time constant ($\tau$) is expressed as the multiplication of a resistance of the resistor 116 and a capacitance of the capacitor 118. When the capacitor 118 is charged up to a threshold voltage of the second inverter 92, the voltage at the coupling point 120 becomes logical HIGH. Consequently, the delay circuitry 52(1) generates the cancellation signal 78 as logical HIGH and the second inverter 92 generates the second gate input signal 100 as logical LOW. As a result, the NAND gate 88 receives the first gate input signal 96 as logical HIGH and the second gate input signal 100 as logical LOW. Hence, the gate output signal 104 becomes logical HIGH and the control signal 110 becomes logical LOW. The ESD clamping circuitry 50 receives the control signal 110 (logical LOW) as the deactivation signal 60' and is deactivated. The RC time constant ($\tau$) of the delay circuitry 52(1) is used to automatically deactivate the ESD clamping circuitry 50 after the ESD clamping circuitry 50 is activated to discharge the ESD event. In this regard, the RC time constant ($\tau$) needs to be fine-tuned to provide sufficient time for the ESD clamping circuitry 50 to discharge the ESD event. The RC time constant ($\tau$) of the delay circuitry 52(1) corresponds to a predetermined protection period of the ESD protection circuit 36(1).

Figure 4:
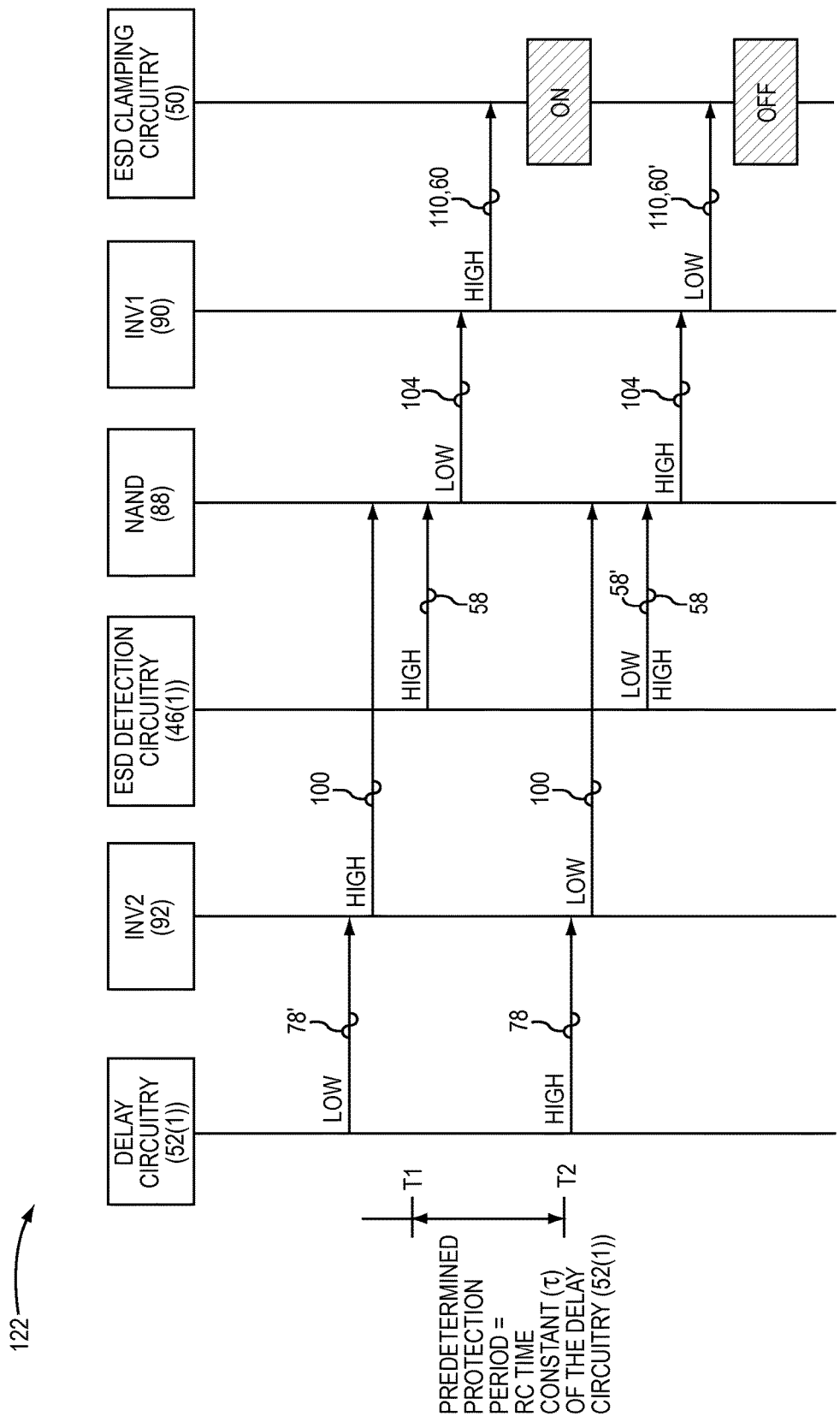
FIG. 4 illustrates an exemplary ESD protection signal flow for activating and deactivating an ESD clamping circuitry in response to detecting the voltage spike exceeding the ESD threshold voltage.

To summarize the ESD protection circuit 36(1) operations in the presence and the absence of the ESD event, FIGS. 4 and 5 are provided. In this regard, FIG. 4 illustrates an exemplary ESD protection signal flow 122 for activating and deactivating the ESD clamping circuitry 50 in response to detecting the voltage spike 40 exceeding the ESD threshold voltage. Elements of FIG. 3 are referenced in connection with FIG. 4 and will not be re-described herein.

With reference to FIG. 4, before the voltage spike 40 exceeds the ESD threshold voltage, the capacitor 118 is not charged since there is no voltage applied between the supply rail 42 and the ground rail 44. As such, the delay circuitry 52(1) provides the cancellation signal 78' to the second inverter 92 as logical LOW. The second inverter 92 inverts the cancellation signal 78' to generate the second gate input signal 100 as logical HIGH. At time $T_1$, the ESD detection circuitry 46(1) detects the voltage spike 40 exceeding the ESD threshold voltage. Consequently, the ESD detection circuitry 46(1) provides the indication signal 58 as logical HIGH, which is received by the NAND gate 88 as the first gate input signal 96 (not shown). The NAND gate 88 generates the gate output signal 104 as logical LOW since both the first gate input signal 96 and the second gate input signal 100 are both logical HIGH. Subsequently, the first inverter 90 inverts the gate output signal 104 to generate the control signal 110 as logical HIGH. The ESD clamping circuitry 50 receives the control signal 110 as the activation signal 60 and is activated to discharge the ESD event associated with the voltage spike 40.

The capacitor 118 in the delay circuitry 52(1) is charged up to the voltage level of the voltage spike 40 at time $T_2$. According to previous discussions, the duration between time $T_2$ and $T_1$ corresponds to the predetermined protection period that is determined by the RC time constant ($\tau$) of the delay circuitry 52(1). In this regard, at time $T_2$, the delay circuitry 52(1) asserts the cancellation signal 78 as logical HIGH. The second inverter 92 inverts the cancellation signal 78 to generate the second gate input signal 100 as logical LOW. As such, the NAND gate 88 generates the gate output signal 104 as logical HIGH regardless whether the first gate input signal 96 is logical HIGH or logical LOW. Subsequently, the first inverter 90 inverts the gate output signal 104 to generate the control signal 110 as logical LOW. The ESD clamping circuitry 50 receives the control signal 110 as the deactivation signal 60' and is deactivated.

Figure 5:
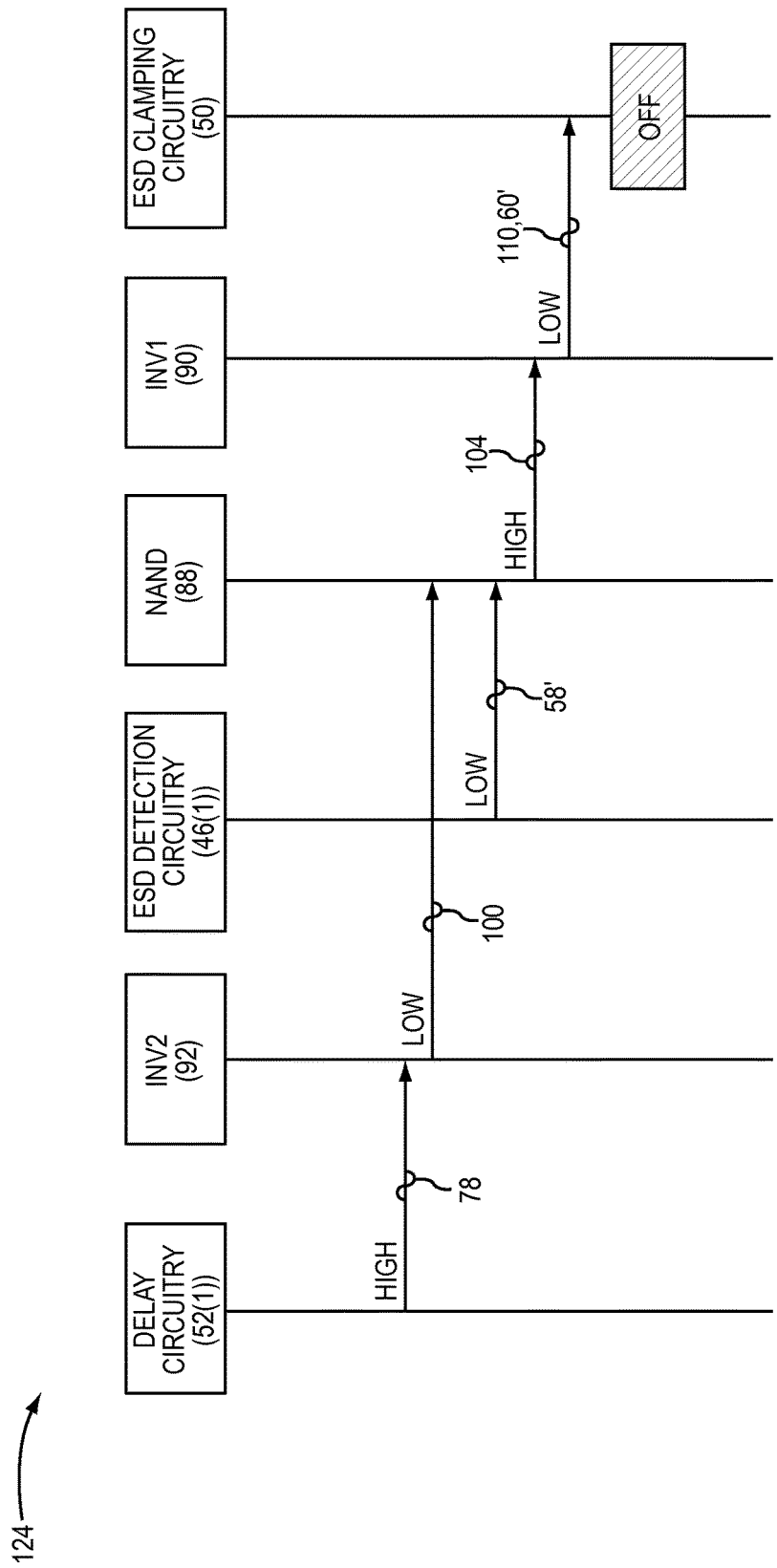
FIG. 5 illustrates an exemplary IC power-up signal flow for preventing an ESD clamping circuitry from being activated when the IC is powered up for normal operation.

As previously discussed in FIG. 2, the ESD protection circuit 36 is configured to provide the IC 38 during fabrication and production processes. If the ESD clamping circuitry 50 is activated when the IC 38 is powered up, the ESD clamping circuitry 50 may result in the IC 38 not being sufficiently powered to perform normal functions. In this regard, FIG. 5 illustrates an exemplary IC power-up signal flow 124 for preventing the ESD clamping circuitry 50 from being activated when the IC 38 is powered up for normal operation. Elements of FIG. 3 are referenced in connection with FIG. 5 and will not be re-described herein.

With reference to FIG. 5, when the voltage source 54 powers up the IC 38, there is no collector-to-emitter breakdown in the open-base bipolar transistor 80, because the voltage source 54 is lower than the ESD threshold voltage. Hence, the ESD detection circuitry 46(1) asserts the indication signal 58' as logical LOW. In this regard, the first gate input signal 96 (not shown) is also asserted as logical LOW. The capacitor 118 (not shown) in the delay circuitry 52(1), however, is charged up to the level of the voltage source 54, causing the delay circuitry 52(1) to provide the cancellation signal 78 as logical HIGH. The second inverter 92 inverts the cancellation signal 78 into the second gate input signal 100 as logical LOW. The NAND gate 88 in turn generates the gate output signal 104 as logical HIGH since both the first gate input signal 96 and the second gate input signal 100 are logical LOW. Subsequently, the first inverter 90 inverts the gate output signal 104 to provide the control signal 110 as logical LOW, which is received by the ESD clamping circuitry 50 as the deactivation signal 60'. Hence, the ESD clamping circuitry 50 remains deactivated when the IC 38 is powered up for operation.

Figure 6:
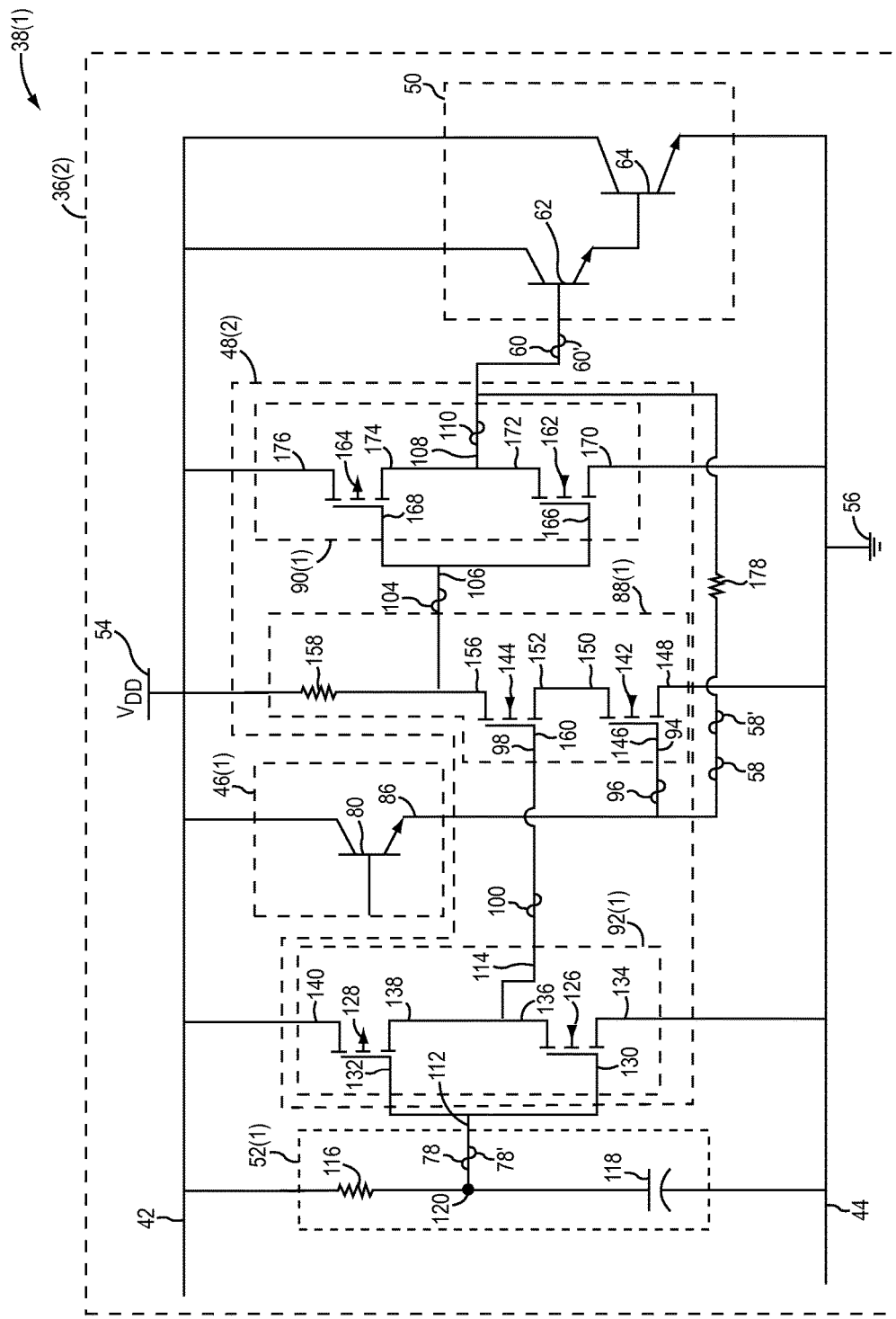
FIG. 6 is a schematic diagram of an exemplary ESD protection circuit configured to prevent an ESD clamping circuitry from being activated unintentionally when the IC in FIG. 2 is powered up.

As discussed above in FIG. 5, the ESD detection circuitry 46(1) is expected to assert the indication signal 58' as logical LOW when the voltage source 54 powers up the IC 38. However, this may not always be the case, because the latch circuitry 48(1) may not always have a deterministic initial state (e.g., the on-state or an off-state). Consequently, the ESD clamping circuitry 50 may be activated unintentionally. In this regard, FIG. 6 is a schematic diagram of an exemplary ESD protection circuit 36(2) configured to prevent the ESD clamping circuitry 50 from being activated unintentionally when the IC 38 is powered up. Elements of FIG. 3 are referenced in connection with FIG. 6 and will not be re-described herein.

With reference to FIG. 6, a second inverter 92(1) is a complementary MOS (CMOS) device comprising a first n-type MOS (nMOS) transistor 126 and a first p-type MOS (pMOS) transistor 128. A first nMOS transistor gate electrode 130 and a first pMOS transistor gate electrode 132 are coupled to provide the second inverter input terminal 112, which is coupled to the coupling point 120 in the delay circuitry 52(1). The first nMOS transistor 126 comprises a first nMOS transistor source electrode 134 coupled to the ground rail 44. A first nMOS transistor drain electrode 136 in the first nMOS transistor 126 and a first pMOS transistor drain electrode 138 in the first pMOS transistor 128 are coupled to provide the second inverter output terminal 114. The first pMOS transistor 128 also has a first pMOS transistor source electrode 140 coupled to the supply rail 42.

A NAND gate 88(1) comprises a second nMOS transistor 142 and a third nMOS transistor 144. The second nMOS transistor 142 has a second nMOS transistor gate electrode 146 coupled to the emitter electrode 86 in the open-base bipolar transistor 80. In this regard, the second nMOS transistor gate electrode 146 is the first input terminal 94 of the NAND gate 88 in FIG. 3. The second nMOS transistor 142 has a second nMOS transistor source electrode 148 coupled to the ground rail 44. The second nMOS transistor 142 also has a second nMOS transistor drain electrode 150 coupled to a third nMOS transistor source electrode 152 in the third nMOS transistor 144. The third nMOS transistor 144 has a third nMOS transistor drain electrode 156 coupled to a load resistor 158, which is coupled to the supply rail 42. As discussed below, the load resistor 158 is provided herein to ensure that a latch circuitry 48(2) is in the off-state and the ESD clamping circuitry 50 is deactivated when the IC 38 is powered up. The third nMOS transistor 144 also comprises a third nMOS transistor gate electrode 160 coupled to the second inverter output terminal 114. In this regard, the third nMOS transistor gate electrode 160 provides the second input terminal 98 in the NAND gate 88 in FIG. 3.

A first inverter 90(1) is also a CMOS device comprising a fourth nMOS transistor 162 and a second pMOS transistor 164. A fourth nMOS transistor gate electrode 166 in the fourth nMOS transistor 162 and a second pMOS transistor gate electrode 168 in the second pMOS transistor 164 are coupled to provide the first inverter input terminal 106 and to receive the gate output signal 104. The fourth nMOS transistor gate electrode 166 and the second pMOS transistor gate electrode 168 are coupled to the supply rail 42 through the load resistor 158. The fourth nMOS transistor 162 also has a fourth nMOS transistor source electrode 170 coupled to the ground rail 44. The fourth nMOS transistor 162 has a fourth nMOS transistor drain electrode 172 coupled to a second pMOS transistor drain electrode 174 in the second pMOS transistor 164. In this regard, the fourth nMOS transistor drain electrode 172 and the second pMOS transistor drain electrode 174 provide the first inverter output terminal 108 and the control signal 110. The second pMOS transistor 164 has a second pMOS transistor source electrode 176 coupled to the supply rail 42.

When the IC 38 is powered up with a fast rise time, the capacitor 118 in the delay circuitry 52(1) cannot be charged up to the voltage source 54 instantaneously. As a result, the delay circuitry 52(1) provides the cancellation signal 78' as logical LOW. The second inverter 92(1) inverts the cancellation signal 78' to provide the second gate input signal 100 to the third nMOS transistor gate electrode 160 as logical HIGH. The second pMOS transistor 164 may pull the control signal 110 up to logical HIGH, which may cause the ESD clamping circuitry 50 to be activated unintentionally. By providing the load resistor 158 with an appropriate resistance in the NAND gate 88(1), it helps to pull the gate output signal 104 to logical HIGH, thus forcing the control signal 110 to become logical LOW to prevent the ESD clamping circuitry 50 from being activated unintentionally. In this regard, the latch circuitry 48(2) is maintained in a deterministic initial state when the IC 38 is powered up.

The ESD protection circuit 36(2) also comprises a resistor 178 coupled between the open-base bipolar transistor 80 in the ESD detection circuitry 46(1) and the first inverter output terminal 108. The resistor 178 is configured to protect the open-base bipolar transistor 80 from being loaded by an on-resistance ($R_{ON}$) associated with the fourth nMOS transistor 162 when the ESD clamping circuitry 50 is activated to discharge the ESD event.

Figure 7:
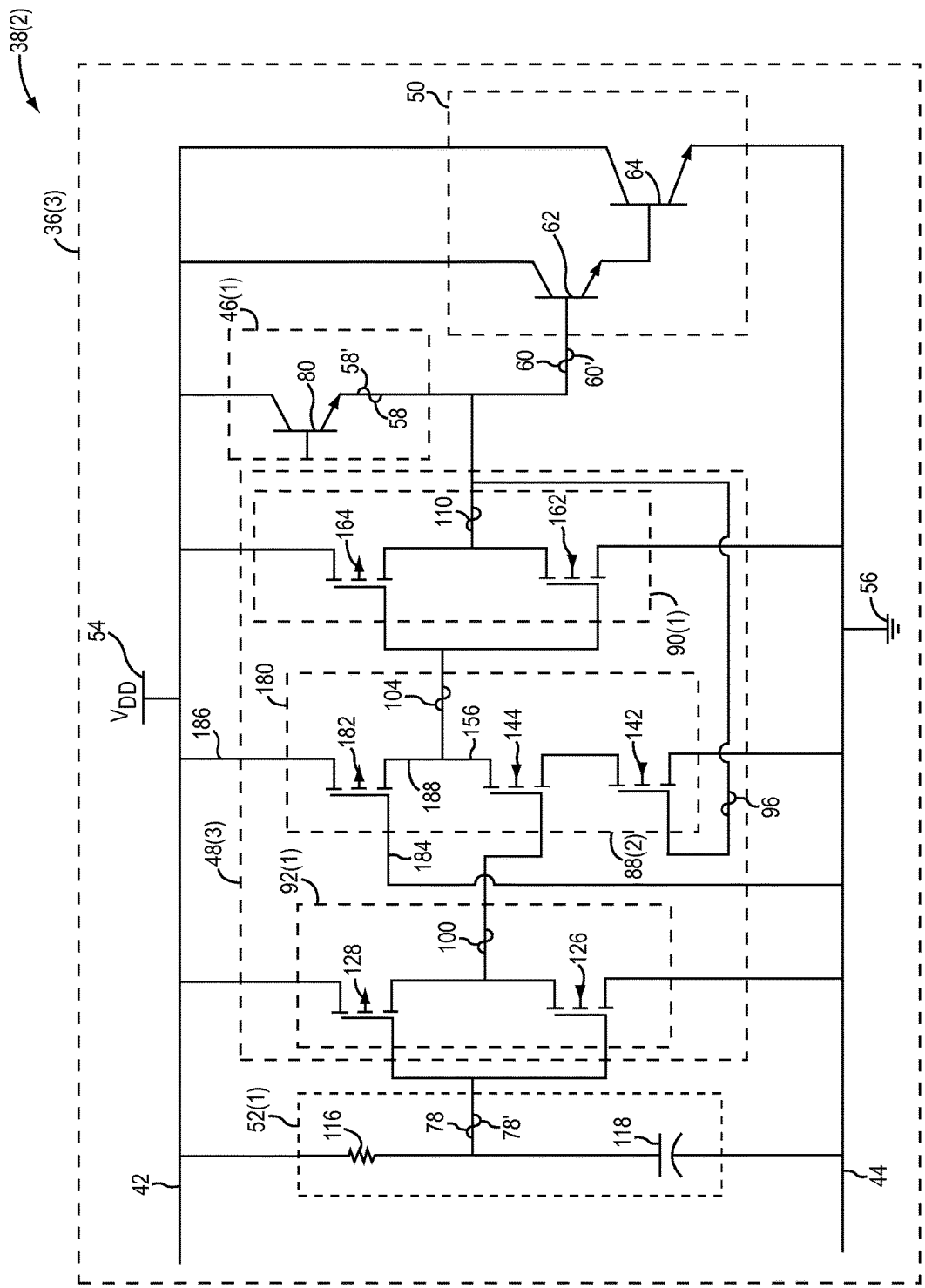
FIG. 7 is a schematic diagram of an exemplary ESD protection circuit wherein a negative-AND (NAND) gate is configured as a complementary metal-oxide semiconductor (CMOS) NAND gate.

Alternative to configuring the NAND gate 88(1) with the second nMOS transistor 142, the third nMOS transistor 144, and the load resistor 158, it is possible to configure the NAND gate 88(1) as a CMOS device. In this regard, FIG. 7 is a schematic diagram of an exemplary ESD protection circuit 36(3), wherein a NAND gate 88(2) is configured as a CMOS NAND gate 180. Common elements between FIGS. 6 and 7 are shown therein with common element numbers and will not be re-described herein.

With reference to FIG. 7, the CMOS NAND gate 180 further comprises a third pMOS transistor 182. The third pMOS transistor 182 has a third pMOS transistor gate electrode 184 coupled to the ground rail 44. The third pMOS transistor 182 has a third pMOS transistor source electrode 186 coupled to the supply rail 42. The third pMOS transistor 182 has a third pMOS transistor drain electrode 188 coupled to the third nMOS transistor drain electrode 156. Since the third pMOS transistor gate electrode 184 is coupled to the ground rail 44, the third pMOS transistor 182 is always conductive between the third pMOS transistor source electrode 186 and the third pMOS transistor drain electrode 188.

In a non-limiting example, the ESD protection circuits 36, 36(1), 36(2), or 36(3) discussed above may be integrated into the IC 38 to protect the IC 38 during the ESD event. In addition, the ESD protection circuits 36, 36(1), 36(2), or 36(3) in the IC 38 may also be configured to provide ESD protection to other functional circuitries in an electronic system. In this regard, FIG. 8 is a schematic diagram of an electronic system 190 wherein the ESD protection circuits 36, 36(1), 36(2), or 36(3) in the IC 38 can be configured to provide ESD protection to at least one other functional circuit 192.

Figure 8:
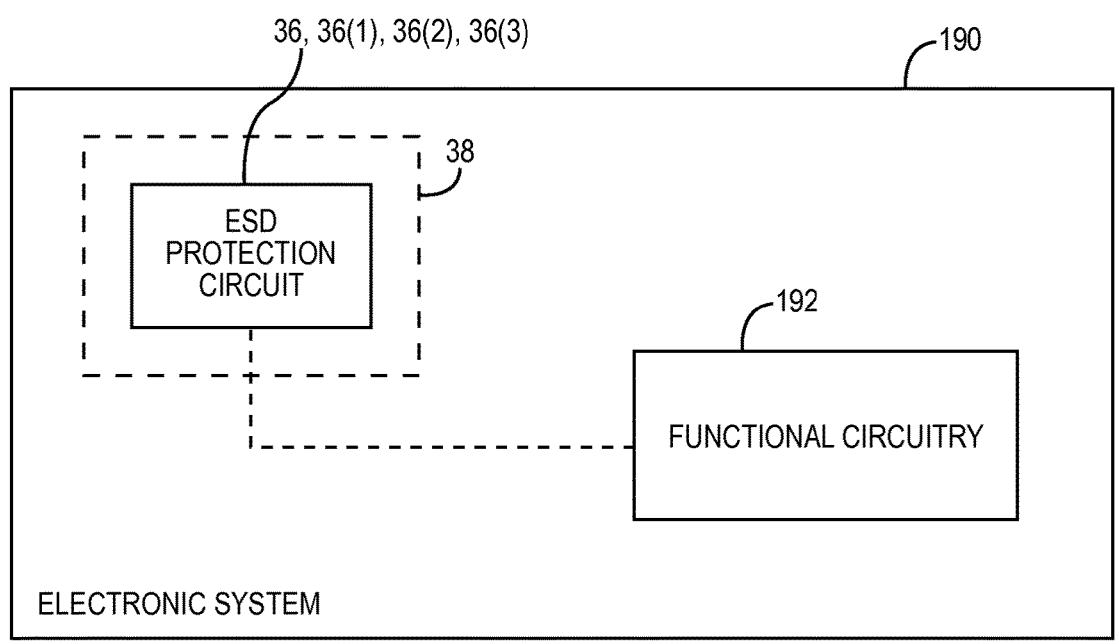
FIG. 8 is a schematic diagram of an electronic system wherein the ESD protection circuits in FIGS. 2, 3, 6, and 7 in the IC in FIG. 2 can be configured to provide ESD protection to at least one other functional circuit.

With reference to FIG. 8, the ESD protection circuits 36, 36(1), 36(2), and 36(3) are integrated into the IC 38. The ESD protection circuits 36, 36(1), 36(2), and 36(3) are configured to detect and discharge the ESD event in the at least one other functional circuit 192 when the at least one other functional circuit 192 is unpowered, as discussed above.

Those skilled in the art will recognize improvements and modifications to the embodiments of the present disclosure. All such improvements and modifications are considered within the scope of the concepts disclosed herein and the claims that follow.

What is claimed is:

1. An electrostatic discharge (ESD) protection circuit in an integrated circuit (IC) comprising:
    ESD clamping circuitry coupled between a supply rail and a ground rail and configured to discharge an ESD event in an IC in response to an activation signal;
    latch circuitry coupled to the ESD clamping circuitry and configured to provide the activation signal in response to receiving an indication signal;
    ESD detection circuitry configured to:
        detect when a voltage between the supply rail and the ground rail exceeds an ESD threshold voltage higher than a supply voltage applied between the supply rail and the ground rail; and
        provide the indication signal in response to detecting the voltage between the supply rail and the ground rail exceeding the ESD threshold voltage;
    delay circuitry coupled to the supply rail and the ground rail and configured to provide a cancellation signal to the latch circuitry after the ESD clamping circuitry is activated for a predetermined protection period; and
    the latch circuitry further configured to provide a deactivation signal to deactivate the ESD clamping circuitry in response to receiving the cancellation signal.

2. The ESD protection circuit of claim 1, wherein the ESD detection circuitry comprises:
    an open-base bipolar transistor comprising:
        an open-base bipolar transistor collector electrode coupled to the supply rail;
        an open-base bipolar transistor emitter electrode coupled to the ground rail through the ESD clamping circuitry; and
        an open-base bipolar transistor base electrode configured to be floating; and
    if the voltage between the supply rail and the ground rail exceeds the ESD threshold voltage, the open-base bipolar transistor is configured to:
        operate in a collector-to-emitter breakdown region;
        provide the indication signal to the latch circuitry; and
        provide a current to the ESD clamping circuitry to discharge the ESD event.

3. The ESD protection circuit of claim 2, wherein the ESD clamping circuitry comprises a first bipolar transistor and a second bipolar transistor disposed according to a Darlington pair arrangement, wherein:
    a first bipolar transistor base electrode is coupled to the latch circuitry to receive the activation signal;
    the first bipolar transistor base electrode is coupled to the ESD detection circuitry to receive the current from the open-base bipolar transistor;
    a first bipolar transistor collector electrode is coupled to the supply rail;

a first bipolar transistor emitter electrode is coupled to a second bipolar transistor base electrode;
a second bipolar transistor collector electrode is coupled to the supply rail; and
a second bipolar transistor emitter electrode is coupled to the ground rail;
in response to receiving the activation signal and the current:
the first bipolar transistor collector electrode and the first bipolar transistor emitter electrode are configured to provide a first bipolar transistor current ($I_1$) larger than the current to the second bipolar transistor base electrode; and
the second bipolar transistor collector electrode and the second bipolar transistor emitter electrode are configured to discharge a second bipolar transistor current ($I_2$) larger than the first bipolar transistor current ($I_1$) to the ground rail.

4. The ESD protection circuit of claim 1, wherein:
the delay circuitry comprises a resistor and a capacitor disposed in a serial arrangement; and
the predetermined protection period corresponds to a resistor-capacitor (RC) time constant of the delay circuitry.

5. The ESD protection circuit of claim 1, wherein the ESD detection circuitry comprises:
an open-base bipolar transistor comprising:
an open-base bipolar transistor collector electrode coupled to the supply rail;
an open-base bipolar transistor emitter electrode coupled to the ground rail through the ESD clamping circuitry; and
an open-base bipolar transistor base electrode configured to be floating; and
if the voltage between the supply rail and the ground rail exceeds the ESD threshold voltage, the open-base bipolar transistor is configured to:
operate in a collector-to-emitter breakdown region;
provide the indication signal to the latch circuitry; and
provide a current to the ESD clamping circuitry to discharge the ESD event.

6. The ESD protection circuit of claim 5, wherein the ESD threshold voltage is at least five volts (5V).

7. The ESD protection circuit of claim 5, wherein the latch circuitry comprises:
a negative-AND (NAND) gate configured to:
receive the indication signal as a first gate input signal;
receive a second gate input signal; and
generate a gate output signal;
a first inverter configured to receive and invert the gate output signal to provide a control signal; and
a second inverter configured to receive and invert the cancellation signal to provide the second gate input signal.

8. The ESD protection circuit of claim 7, wherein:
the control signal is the activation signal when the indication signal is asserted and the cancellation signal is de-asserted; and
the control signal is the deactivation signal when the cancellation signal is asserted and the indication signal is de-asserted.

9. The ESD protection circuit of claim 8, wherein the ESD clamping circuitry comprises a first bipolar transistor and a second bipolar transistor disposed according to a Darlington pair arrangement, wherein:
a first bipolar transistor base electrode is coupled to the first inverter to receive the control signal;
the first bipolar transistor base electrode is coupled to the open-base bipolar transistor emitter electrode to receive the current;
a first bipolar transistor collector electrode is coupled to the supply rail;
a first bipolar transistor emitter electrode is coupled to a second bipolar transistor base electrode;
a second bipolar transistor collector electrode is coupled to the supply rail; and
a second bipolar transistor emitter electrode is coupled to the ground rail;
in response to receiving the activation signal and the current:
the first bipolar transistor collector electrode and the first bipolar transistor emitter electrode are configured to provide a first bipolar transistor current ($I_1$) larger than the current to the second bipolar transistor base electrode; and
the second bipolar transistor collector electrode and the second bipolar transistor emitter electrode are configured to discharge a second bipolar transistor current ($I_2$) larger than the first bipolar transistor current ($I_1$) to the ground rail.

10. The ESD protection circuit of claim 9, wherein the ESD clamping circuitry configured to discharge the ESD event in response to receiving the activation signal and the current.

11. The ESD protection circuit of claim 9, wherein the first bipolar transistor base electrode coupled to the open-base bipolar transistor emitter electrode through a resistor configured to protect the open-base bipolar transistor from being loaded by an on-resistance ($R_{ON}$) associated with the first inverter when the ESD clamping circuitry is activated.

12. The ESD protection circuit of claim 7, wherein the second inverter comprises a first n-type metal-oxide semiconductor (MOS) (nMOS) transistor and a first p-type MOS (pMOS) transistor, wherein:
a first nMOS transistor gate electrode and a first pMOS transistor gate electrode are coupled to the delay circuitry to receive the cancellation signal;
a first nMOS transistor source electrode is coupled to the ground rail;
a first nMOS transistor drain electrode is coupled to a first pMOS transistor drain electrode to provide the second gate input signal to the NAND gate; and
a first pMOS transistor source electrode is coupled to the supply rail.

13. The ESD protection circuit of claim 12, wherein the NAND gate comprises:
a load resistor, a second nMOS transistor and a third nMOS transistor, wherein:
the load resistor is coupled to the supply rail;
a second nMOS transistor gate electrode is coupled to the open-base bipolar transistor emitter electrode in the ESD detection circuitry to receive the indication signal as the first gate input signal;
a second nMOS transistor source electrode is coupled to the ground rail;
a second nMOS transistor drain electrode is coupled to a third nMOS transistor source electrode;
a third nMOS transistor drain electrode is coupled to the load resistor; and
a third nMOS transistor gate electrode is coupled to the first nMOS transistor drain electrode and the first pMOS transistor drain electrode to receive the second gate input signal.

14. The ESD protection circuit of claim 13, wherein the load resistor is configured to maintain the ESD detection circuitry in a deterministic initial state when an operation voltage lower than the ESD threshold voltage is applied between the supply rail and the ground rail.

15. The ESD protection circuit of claim 13, wherein the first inverter comprises a fourth nMOS transistor and a second pMOS transistor, wherein:
 a fourth nMOS transistor gate electrode and a second pMOS transistor gate electrode are coupled to the third nMOS transistor drain electrode to receive the gate output signal;
 a fourth nMOS transistor source electrode is coupled to the ground rail;
 a fourth nMOS transistor drain electrode is coupled to a second pMOS transistor drain electrode to provide the control signal; and
 a second pMOS transistor source electrode is coupled to the supply rail.

16. The ESD protection circuit of claim 12, wherein the NAND gate comprises:
 a second nMOS transistor, a third nMOS transistor, and a third pMOS transistor, wherein:
  a second nMOS transistor gate electrode is coupled to the open-base bipolar transistor emitter electrode to receive the indication signal as the first gate input signal;
  a second nMOS transistor source electrode is coupled to the ground rail;
  a second nMOS transistor drain electrode is coupled to a third nMOS transistor source electrode;
  a third nMOS transistor drain electrode is coupled to a third pMOS transistor drain electrode; and
  a third nMOS transistor gate electrode is coupled to the first nMOS transistor drain electrode and the first pMOS transistor drain electrode to receive the second gate input signal;
  a third pMOS transistor source electrode is coupled to the supply rail; and
  a third pMOS transistor gate electrode is coupled to the ground rail.

17. The ESD protection circuit of claim 16, wherein the first inverter comprises a fourth nMOS transistor and a second pMOS transistor, wherein:
 a fourth nMOS transistor gate electrode and a second pMOS transistor gate electrode are coupled to the third nMOS transistor drain electrode and the third pMOS transistor drain electrode to receive the gate output signal;
 a fourth nMOS transistor source electrode is coupled to the ground rail;
 a fourth nMOS transistor drain electrode is coupled to a second pMOS transistor drain electrode to provide the control signal; and
 a second pMOS transistor source electrode is coupled to the supply rail.

18. An electronic system, comprising:
 at least one functional circuit; and
 an electrostatic discharge (ESD) protection circuit coupled to the at least one functional circuit, comprising:
  ESD clamping circuitry coupled between a supply rail and a ground rail and configured to discharge an ESD event in the at least one functional circuit in response to an activation signal;
  latch circuitry coupled to the ESD clamping circuitry and configured to provide the activation signal in response to receiving an indication signal; and
  ESD detection circuitry configured to:
   detect when a voltage between the supply rail and the ground rail exceeds an ESD threshold voltage higher than a supply voltage applied between the supply rail and the ground rail; and
   provide the indication signal in response to detecting the voltage between the supply rail and the ground rail exceeding the ESD threshold voltage;
 wherein the ESD protection circuit is configured to discharge the ESD event independent of whether the at least one functional circuit is powered or unpowered.

* * * * *